United States Patent
Song et al.

(10) Patent No.: US 11,088,230 B2
(45) Date of Patent: Aug. 10, 2021

(54) PIXEL CIRCUIT, MANUFACTURING METHOD THEREOF, AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/338,125

(22) PCT Filed: Jul. 26, 2018

(86) PCT No.: PCT/CN2018/097236
§ 371 (c)(1),
(2) Date: Mar. 29, 2019

(87) PCT Pub. No.: WO2019/024760
PCT Pub. Date: Feb. 7, 2019

(65) Prior Publication Data
US 2020/0027938 A1    Jan. 23, 2020

Related U.S. Application Data

(63) Continuation of application No. PCT/CN2018/097236, filed on Jul. 26, 2018.

(30) Foreign Application Priority Data

Aug. 1, 2017 (CN) .......................... 201710646875.2

(51) Int. Cl.
*H01L 27/32* (2006.01)
*H01L 27/12* (2006.01)

(52) U.S. Cl.
CPC ...... *H01L 27/3258* (2013.01); *H01L 27/1251* (2013.01); *H01L 27/1255* (2013.01);
(Continued)

(58) Field of Classification Search
CPC ............. H01L 27/3248; H01L 27/3258; H01L 27/3262; H01L 27/3265
See application file for complete search history.

(56) References Cited

U.S. PATENT DOCUMENTS 7,825,406 B2    11/2010  Yoshida et al.
8,212,247 B2    7/2012   Kang et al.
(Continued)

FOREIGN PATENT DOCUMENTS

| CN | 101542735 A | 9/2009 |
| CN | 101958339 A | 1/2011 |
| CN | 106486495 A | 3/2017 |

OTHER PUBLICATIONS

International Search Report and Written Opinion dated Nov. 1, 2018 from State Intellectual Property Office of the P.R. China.
(Continued)

*Primary Examiner* — Vijay Shankar
*Assistant Examiner* — Nathaniel P Brittingham
(74) *Attorney, Agent, or Firm* — Dilworth & Barrese, LLP.; Michael J. Musella, Esq.

(57) ABSTRACT

A pixel circuit includes a substrate, and a first thin film transistor and a second transistor which are disposed on the substrate. The first thin film transistor is in a top-gate structure, and the second thin film transistor is in a bottom-gate structure; a first electrode of the first thin film transistor is electrically connected with a gate electrode of the second thin film transistor, and the first electrode of the first thin film transistor and the gate electrode of the second thin film transistor are in a same layer on the substrate. The pixel
(Continued)

circuit can have a relatively high switch speed and a relatively large driving current, a manufacturing method is easily realized and a process cost is relatively low.

19 Claims, 6 Drawing Sheets

(52) U.S. Cl.
CPC ...... *H01L 27/3248* (2013.01); *H01L 27/3262* (2013.01); *H01L 27/3265* (2013.01)

(56) References Cited

U.S. PATENT DOCUMENTS

| | | | |
|---|---|---|---|
| 10,186,529 B2 | 1/2019 | Noh | |
| 2010/0213442 A1* | 8/2010 | Yoshida | H01L 51/0003 |
| | | | 257/40 |
| 2012/0007093 A1* | 1/2012 | Yamamoto | H01L 27/1229 |
| | | | 257/72 |
| 2014/0084282 A1* | 3/2014 | Cao | H01L 29/51 |
| | | | 257/43 |
| 2016/0163780 A1* | 6/2016 | Park | H01L 27/3248 |
| | | | 257/40 |
| 2016/0372497 A1 | 12/2016 | Lee et al. | |
| 2017/0062545 A1 | 3/2017 | Oh et al. | |
| 2017/0154941 A1* | 6/2017 | Oh | H01L 27/1248 |
| 2017/0194405 A1 | 7/2017 | Tang | |
| 2018/0114823 A1* | 4/2018 | Lee | G09G 3/3241 |
| 2018/0301090 A1* | 10/2018 | Kuang | G09G 3/3258 |

OTHER PUBLICATIONS

European search report issued by the European Patent Office for the corresponding European Patent Application No. 18840972.6 dated Mar. 26, 2021.

* cited by examiner

PIXEL CIRCUIT, MANUFACTURING METHOD THEREOF, AND DISPLAY DEVICE

TECHNICAL FIELD

Embodiments of the present disclosure relate to a pixel circuit and a manufacturing method thereof and a display device.

BACKGROUND

An organic light emitting diode (OLED) display device is becoming one of a new generation of display device, for advantages such as active light emission, high contrast, rapid response and being thinner and lighter. An operation principle of the OLED device is to apply a suitable voltage to an anode and a cathode through a pixel circuit so as to allow an organic light emitting layer between the anode and the cathode to emit light to realize image display.

A thin film transistor (TFT) is an important element in the pixel circuit and a device structure and a manufacturing process both exert a great influence on a performance of the thin film transistor.

SUMMARY

Embodiments of the present disclosure provide a pixel circuit, which comprises: a substrate, and a first thin film transistor and a second transistor which disposed on the substrate, wherein the first thin film transistor is in a top-gate structure, and the second thin film transistor is in a bottom-gate structure; a first electrode of the first thin film transistor is electrically connected with a gate electrode of the second thin film transistor, and the first electrode of the first thin film transistor and the gate electrode of the second thin film transistor are in a same layer on the substrate.

In some examples, the pixel circuit further comprises a capacitor disposed on the substrate, the capacitor comprising a first electrode, a second electrode and a dielectric layer between the first electrode and the second electrode; the first electrode of the capacitor is electrically with the first electrode of the first thin film transistor and the gate electrode of the second thin film transistor, and the first electrode of the capacitor, the first electrode of the first thin film transistor and the gate electrode of the second thin film transistor are in a same layer on the substrate.

In some examples, a gate electrode and a second electrode of the first thin film transistor, a first electrode and a second electrode of the second thin film transistor and the second electrode of the capacitor are in a same layer, and the first electrode of the second thin film transistor is electrically connected with the second electrode of the capacitor.

In some examples, the first thin film transistor further comprises a buffer layer between the first electrode and an active layer of the first thin film transistor, and the buffer layer, a gate insulating layer of the second thin film transistor and the dielectric layer of the capacitor are in a same layer.

In some examples, the pixel circuit further comprises a pixel electrode; the pixel electrode is electrically connected with the first electrode of the second thin film transistor and the second electrode of the capacitor.

In some examples, the pixel circuit further comprises a pixel electrode; the pixel electrode is electrically connected with the second electrode of the second thin film transistor.

In some examples, an active layer of the first thin film transistor is in a same layer as an active layer of the second thin film transistor.

In some examples, the second thin film transistor further comprises an etch stop layer, and the etch stop layer is in a same layer as a gate insulating layer of the first thin film transistor.

In some examples, an active layer of the first thin film transistor comprises a first region, a second region and a channel region between the first region and the second region; the first region of the active layer of the first thin film transistor is electrically connected with the first electrode of the first thin film transistor through a via hole, and the first region is filled in the via hole.

In some examples, the first region and the second region of the active layer of the first thin film transistor are conductors.

In some examples, the second electrode of the capacitor and the first electrode of the second thin film transistor are in an integral structure.

In some examples, a gate insulating layer of the second thin film transistor and the dielectric layer of the capacitor are in a same layer and made of a same material.

Embodiments of the present disclosure further provide a manufacturing method of a pixel circuit, comprising: providing a substrate, and forming a first thin film transistor and a second thin film transistor on the substrate, wherein the first thin film transistor is in a top-gate structure, and the second thin film transistor is in a bottom-gate structure; a first electrode of the first thin film transistor and a gate electrode of the second thin film transistor are formed to be electrically connected with each other and disposed in a same layer, by forming a first metal layer on the substrate and patterning the first metal layer.

In some examples, a capacitor, the first thin film a transistor and the second thin film transistor are formed simultaneously; a first electrode of the capacitor is further formed by patterning the first metal layer, and the first electrode is electrically connected with the first electrode of the first thin film transistor and the gate electrode of the second thin film transistor.

In some examples, the forming the first thin film transistor and the second thin film transistor on the substrate comprises: forming a first insulating layer on the first metal layer and patterning the first insulating layer to expose at least a portion of the first electrode of the first thin film transistor, forming a semiconductor layer on the first insulating layer and patterning the semiconductor layer to form an active layer of the first thin film transistor and an active layer of the second thin film transistor, wherein the active layer of the first thin film transistor contacts the exposed portion of the first electrode of the first thin film transistor through a via hole, forming a second insulating layer on the semiconductor layer and patterning the second insulating layer to form a gate insulating layer on the active layer of the first thin film transistor and an etch stop layer on the active layer of the second thin film transistor, and forming a second metal layer on the second insulating layer and patterning the second insulating layer to form a second electrode and a gate electrode of the first thin film transistor, and a first electrode and a second electrode of the second thin film transistor.

In some examples, the forming the first thin film transistor and the second thin film transistor on the substrate further comprises: after forming the semiconductor layer and before forming the second insulating layer, performing a conduction treatment on a portion, which is not covered by the gate insulating layer, of the active layer of the first thin film transistor, and on a portion, which is not covered by the etch stop layer, of the active layer of the second thin film transistor.

In some examples, the conduction treatment comprises: performing ion implantation on the active layer of the first thin film transistor and the active layer of the second thin film transistor using the gate insulating layer of the first thin film transistor and the etch stop layer as a mask.

In some examples, the manufacturing method further comprises: forming a passivation layer on the second metal layer, patterning the passivation layer to expose at least a portion of the first electrode of the second thin film transistor, and forming a conductive layer on the passivation layer, the conductive layer in contact with the portion, which is exposed, of the first electrode of the second thin film transistor.

Embodiments of the present disclosure further provide a display device, comprising the above pixel circuit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
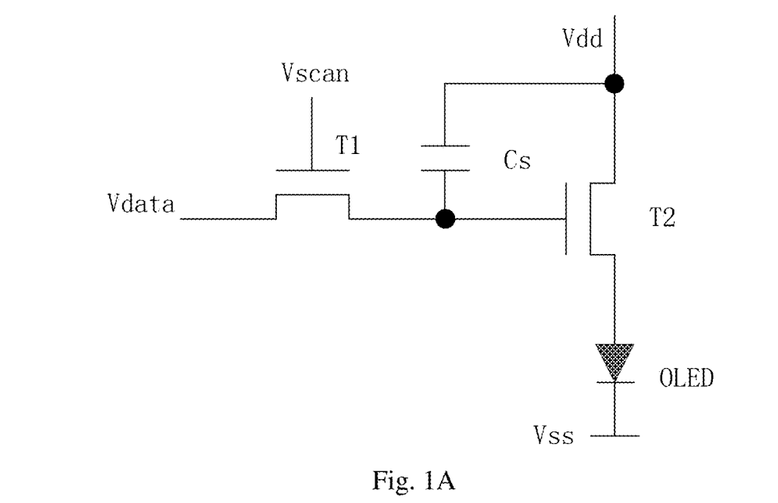
FIG. 1A is a schematic view of a 2T1C pixel circuit.
Figure 1B:
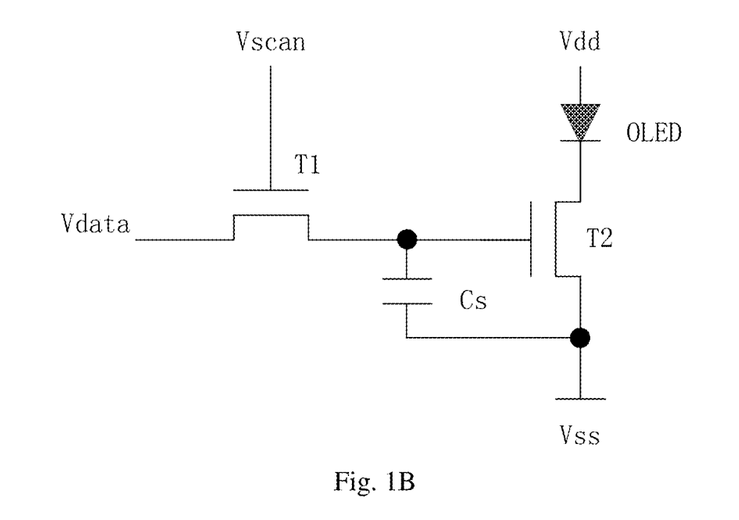
FIG. 1B is a schematic view of another 2T1C pixel circuit.

An OLED display device usually comprises a plurality of pixel units arranged in an array, each pixel unit comprises a plurality of sub-pixels, and each sub-pixel comprises a pixel driving circuit and an OLED element. The pixel driving circuit is configured to drive the OLED to emit light with a pre-determined intensity based on a data signal. The pixel driving circuit usually comprises a 2T1C pixel circuit, that is, two TFTs and one storage capacitor Cs are used to realize a basic function of driving the OLED to emit light. One TFT is a switch transistor, which mainly functions as a switch and controls a transmission of a data signal; the other TFT is a driving transistor, which mainly functions as a driver and provides a driving current for a pixel electrode which acts as a cathode or an anode of the OLED element. FIG. 1A and FIG. 1B respectively illustrate schematic views of two types of 2T1C pixel circuits.

As illustrated in FIG. 2A, a type of 2T1C pixel driving circuit comprises a switch transistor T1, a driving transistor T2 and a storage capacitor Cs. For example, the switch transistor T1 and the driving transistor T2 are both n-type TFTs. A gate electrode of the switch transistor T1 is connected with a gate line (a scan line) to receive a scan signal (Vscan), a drain electrode is connected with a data line to receive a data signal (Vdata), and a source electrode is connected with a gate electrode of the driving transistor T2. A drain electrode of the driving transistor T2 is connected with a first power source terminal (Vdd, a high voltage terminal) and a source electrode is connected with a positive terminal of OLED. One terminal of the storage capacitor Cs is connected with the source electrode of the switch transistor T1 and the gate electrode of the driving transistor T2, and the other terminal is connected with the drain electrode of the driving transistor T2 and the first power source terminal. A negative terminal of the OLED is connected with a second power source terminal (Vss, a low voltage terminal), for example, to the ground. A driving manner of the 2T1C pixel circuit is to control bright and dark (a greyscale) of a pixel by two TFTs and a storage capacitor Cs. When the scan signal Scan is applied by the gate line to turn on the switch transistor T1, the data voltage (Vdata) which is sent through the data line by a data driving circuit charges the storage capacitor Cs through the switch transistor T1, so as to store the data voltage in the storage capacitor Cs. The stored data voltage controls a conduction degree of the driving transistor T2 so as to control a value of current which runs through the driving transistor to drive the OLED to emit light; that is, the current determines an emission greyscale of the pixel.

As illustrated in FIG. 1B, another type of 2T1C pixel circuit comprises a switch transistor T1, a driving transistor T2 and a storage capacitor Cs, but a connection manner is slight changed. More specifically, a change of the pixel circuit of FIG. 1B compared to the pixel circuit of FIG. 1A comprises: the positive terminal of the OLED is connected with the first voltage terminal (Vdd, a high voltage terminal), the negative terminal is connected with the drain electrode of the driving transistor T2 and the source electrode of the driving electrode T2 is connected with the second voltage terminal Vss (a low voltage terminal), for example to the ground. One terminal of the storage capacitor Cs is connected with the source electrode of the switch transistor T1 and the gate electrode of the driving transistor T2, and the other terminal is connected with the source electrode of the driving transistor T2 and the second voltage terminal. An operation manner of the 2T1C pixel circuit is substantially same as that of the pixel circuit as illustrated in FIG. 1A, which is not repeated here.

For example, based on the above 2T1C pixel circuit, in order to compensate for a threshold drift of the driving transistor, a voltage drop caused by resistance of a power line, and the like, the pixel driving circuit may further comprise a compensation circuit, which comprises an internal compensation circuit or an external compensation circuit. The compensation circuit may comprise a transistor, a capacitor or the like. The pixel driving circuit may further comprise a reset circuit, a sensing circuit and the like according to need, which is not repeated here.

A performance of a thin film transistor depends on its structure to a large extent. A basic structure of a thin film transistor comprises a bottom-gate structure and a top-gate structure. Usually a thin film transistor in a top-gate structure has relatively small parasitic capacitance and therefore has a higher switching speed, and a thin film transistor in a bottom-gate structure has a relatively large on-current and a high electrical stability. Limited to process technologies, for example, in a manufacturing process of the above 2T1C pixel circuit, the switch transistor and the driving transistor usually adopt a same structure and it is difficult to manufacture the two structures simultaneously on a same substrate to obtain advantages of the both.

At least one embodiment of the present disclosure provides a pixel circuit and a manufacturing method thereof, and an organic light emitting diode display device to which the pixel circuit is applied. The pixel circuit adopts a top-gate switch transistor and a bottom-gate driving transistor, combining advantages of transistors in both structures, so as to enable the pixel circuit to have a relatively high switching speed as well as a relatively large driving current, and thereby a display performance of the display device is improved. In at least an embodiment, the top-gate switch transistor and the bottom-gate driving transistor of the pixel circuit may be formed simultaneously in a same process, the process is easily realized and a cost is saved.

An embodiment of the present disclosure provide a pixel circuit, which comprises a substrate and a first thin film transistor and a second thin film transistor which are on the substrate. The first thin film transistor is in a top-gate structure, and the second thin film transistor is in a bottom-gate structure; a first electrode of the first thin film transistor is electrically connected with a gate electrode of the second thin film transistor, and the first electrode of the first thin film transistor and the gate electrode of the second thin film transistor are in a same layer on the substrate.

Another embodiment of the present disclosure further provides a display device comprising the above pixel circuit.

Still another embodiment of the present disclosure further provides a manufacturing method of a pixel circuit, which comprises: providing a substrate, and forming a first thin film transistor and a second thin film transistor on the substrate. The first thin film transistor is in a top-gate structure, and the second thin film transistor is in a bottom-gate structure; a first electrode of the first thin film transistor and a gate electrode of the second thin film transistor are formed to be electrically connected with each other and in a same layer, by forming a first metal layer on the substrate and patterning the first metal layer.

The description "in a same layer" in the present disclosure means exemplarily two structures/patterns are formed of a same material layer through one patterning process and thereby located in a same layer, rather than limiting the two structures/patterns to be at a same level.

The pixel circuit and the manufacturing method thereof and the display device provided by embodiments of the present disclosure are described in detail below, in combination with the drawings, so as to make the technical solutions of the embodiments of the present disclosure more clear.

Figure 2:
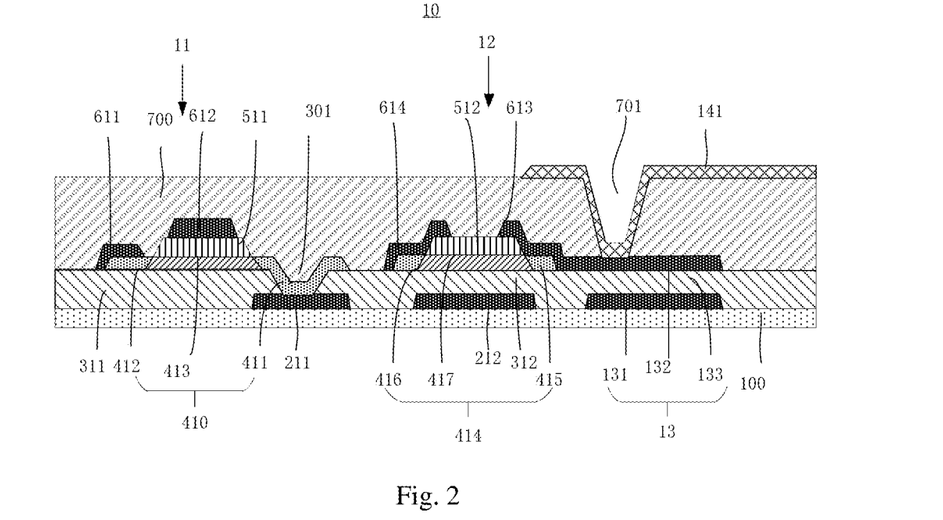
FIG. 2 is a schematic sectional view of a pixel circuit provided by an embodiment of the present disclosure.

Referring to FIG. 2, FIG. 2 is a schematic sectional view of a pixel circuit 10 provided by an embodiment of the present disclosure. The pixel circuit 10 may be applied in an OLED display device, exemplarily corresponds to a 2T1C pixel driving circuit or other pixel driving circuits comprising a 2T1C unit. As illustrated in FIG. 2, the pixel circuit 10 comprises a substrate 100, and a first zone and a second zone are defined on the substrate 100. A first thin film transistor 11 is disposed in the first zone on the substrate 100, and the second thin film transistor 12 is disposed in the second zone on the substrate 100.

The first thin film transistor 11 is in a top-gate structure, comprising a first electrode 211, a buffer layer 311, an active layer 410, a gate insulating layer 511, and a second electrode 611 and a gate electrode 612 which are sequentially stacked on the substrate 100. The active layer 410 comprises a first region 411, a second region 412 and a channel region 413 between the first region 411 and the second region 412. The gate insulating layer 511 is above the channel region 413 and covers the channel region 413. The first region 411 and the second region 412 are not covered by the gate insulating layer 511. The first region fills a via hole 301 and contacts the first electrode 211, and the second region 412 is in contact with the second electrode 611.

The second thin film transistor 12 is in a bottom-gate structure, comprising a gate electrode 212, a gate insulating layer 312, an active layer 414, an etch stop layer 512, and a first electrode 613 and a second electrode 614 which are sequentially stacked on the substrate 100. The active layer 414 comprises a first region 415, a second region 416 and a channel region 417 between the first region 415 and the second region 416. The etch stop layer 512 is located above the channel region 417 and covers the channel region 417. The first region 415 and the second region 416 are not covered by the etch stop layer 512, and the first region 415 and the second region 416 are respectively in contact with the first electrode 613 and the second electrode 614 which are respectively located above the first region 415 and the second region 416.

The first thin film transistor 11 and the second thin film transistor 12 are formed in a same process flow, which is described below in detail. The first electrode 211 of the first thin film transistor 11 is electrically connected with the gate electrode 212 of the second thin film transistor and is in a same layer as the gate electrode 212 of the second thin film transistor on the substrate 100. The buffer layer 311 of the first thin film transistor 11 and the gate insulating layer 312 of the second thin film transistor 12 are in a same layer. The active layer 410 of the first thin film transistor 11 and the active layer 414 of the second thin film transistor 12 are in a same layer. The gate insulating layer 511 of the first thin film transistor 11 and the etch stop layer 512 of the second thin film transistor 12 are in a same layer. The second electrode 611 and the gate electrode 612 of the first thin film transistor 11 and the first electrode 613 and the second electrode 614 of the second thin film transistor 12 are in a same layer.

Further, the pixel circuit 10 may further comprise a capacitor 13 on the substrate 100. The capacitor 13 comprises a first electrode 131, a second electrode 132 and a dielectric layer 133 between the first electrode 131 and the second electrode 132. The first electrode 131 of the capacitor 13, the first electrode 211 of the first thin film transistor 11 and the gate electrode 212 of the second thin film transistor 12 are in a same layer on the substrate 100, and are electrically connected with each other. The second electrode 132 of the capacitor 13, the gate electrode 612 and the second electrode 611 of the first thin film transistor 11, the first electrode 613 and the second electrode 614 of the second thin film transistor 12 are in a same layer, and the second electrode 132 of the capacitor 13 is electrically connected with the first electrode 613 of the second thin film transistor 12. The dielectric layer 313 of the capacitor 13, the buffer layer 311 of the first thin film transistor 11, the gate insulating layer 312 of the second thin film transistor 12 are in a same layer.

Further, the pixel circuit 10 may further comprise a passivation layer 700 on the first thin film transistor 11 and the second thin film transistor 12 and a pixel electrode 141 on the passivation layer 700. The pixel electrode 141 is electrically connected with the second thin film transistor 12 through a via hole 701.

After that, an OLED element is formed on the pixel electrode 141. The OLED element comprises a laminate structure. The laminate structure comprises a cathode, an anode and an organic light emitting layer between the cathode and the anode. Additionally, the laminate structure may further comprise functional layers such as a hole injection layer, a hole transport layer, an electron injection layer and an electron transport layer. The pixel electrode 141 may be the cathode or the anode, or electrically connected with the cathode or the anode. Therefore, a suitable conductive material may be selected for forming the pixel electrode 141, such as a transparent conductive material (indium tin oxide (ITO) and the like) or a metal material (e.g. aluminum or aluminum alloy and the like). Besides, the OLED element may be in a top-emission structure, a bottom-emission structure, a double-side-emission structure or the like.

Figure 3:
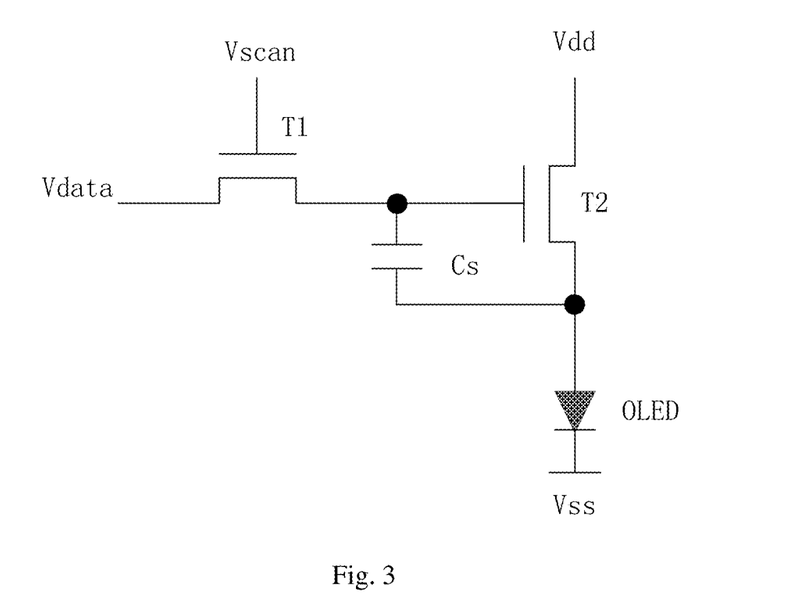
FIG. 3 is an equivalent circuit diagram of a pixel circuit provided by an embodiment of the present disclosure.

In the embodiment, the pixel electrode 141 is electrically connected with the first electrode 613 of the second thin film transistor 12, and an equivalent circuit diagram thereof is as illustrated in FIG. 3. The first thin film transistor 11, the second thin film transistor 12 and the capacitor 13 respectively correspond to the first thin film transistor T1, the second thin film transistor T2 and the storage capacitor Cs. An operation principle of the pixel circuit 10 is described below taking the first thin film transistor T1 and the second thin film transistor T2 as n-type transistors, the first electrode as a source electrode, the second electrode as a drain electrode for example, in combination with FIG. 3.

As illustrated in FIG. 3, the gate electrode of the first thin film transistor T1 is connected with a gate line (a scan line) to receive a scan signal (Vscan), the drain electrode is connected with a data line to receive a data signal (Vdata), and the source electrode is connected with the gate electrode of the second thin film transistor T2. The drain electrode of the second thin film transistor T2 is connected with a first power source terminal (Vdd, a high voltage terminal), the source electrode is connected with the pixel electrode, that is, the positive terminal of the OLED. The first electrode of the storage capacitor Cs is connected with the source electrode of the first thin film transistor T1 and the gate electrode of the second thin film transistor T2, the second electrode is connected with the source electrode of the second thin film transistor T2 and the pixel electrode. The negative terminal of the OLED is connected with a second power source terminal (Vss, a low voltage terminal), for example, to the ground. For example, the pixel electrode may be further connected with an external compensation circuit (not shown in the figure) according to need; the compensation circuit allows the pixel circuit to maintain at a low potential before the storage capacitor Cs starts charging. A driving manner of the 2T1C pixel circuit is to control bright and dark (a greyscale) of a pixel by the two TFTs and the storage capacitor Cs. When the scan signal Vscan is applied by the gate line to turn on the first thin film transistor T1, the data voltage (Vdata) which is sent through the data line by a data driving circuit charges the storage capacitor Cs through the first thin film transistor T1, so as to store the data voltage in the storage capacitor Cs. The stored data voltage controls a conduction degree of the second thin film transistor T2 so as to control a value of a current which runs through the second thin film transistor T2 to drive the OLED to emit light; that is, the current determines an emission greyscale of the pixel.

Figure 4:
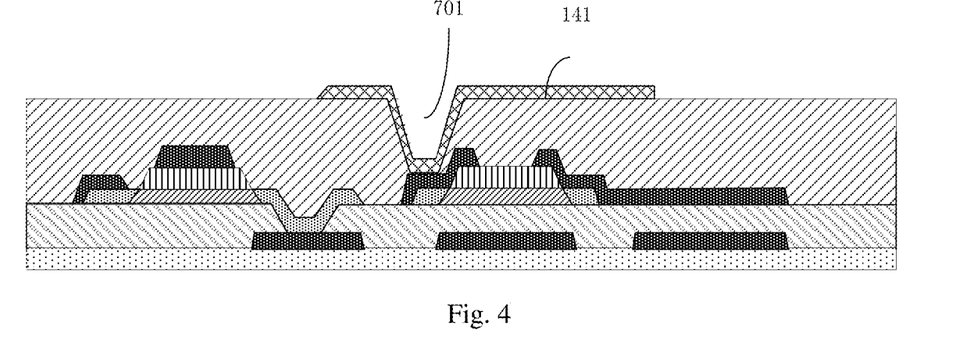
FIG. 4 is a schematic sectional view of a pixel circuit provided by a modified embodiment of an embodiment of the present disclosure.

In another example, the pixel electrode 141 may be electrically connected with the second electrode 614 of the second thin film transistor 12, as illustrated in FIG. 4. In this situation, an equivalent circuit of the pixel circuit 10 is the circuit of FIG. 1A, an operation principle of which is no longer repeated here.

For example, the first thin film transistor 11 may be an n-type thin film transistor or a p-type thin film transistor, and the second thin film transistor 12 may be an n-type thin film transistor or a p-type thin film transistor. The first electrode 211 of the first thin film transistor 11 may be a source electrode or a drain electrode, accordingly the second electrode 611 may a drain electrode or a source electrode, the first region 411 may be a source region or a drain region, and the second region 413 correspondingly may be a drain region or a source region. The first electrode 613 of the second thin film transistor 12 may be a source electrode or a drain electrode, accordingly the second electrode 614 may a drain electrode or a source electrode, the first region 415 correspondingly may be a source region or a drain region, and the second region 416 correspondingly may be a drain region or a source region.

For example, the active layer 410 of the first thin film transistor 11 and the active layer 414 of the second thin film transistor 12 include but are not limited to a silicon-based material (such as amorphous silicon a-Si, polycrystalline silicon p-Si), a metal oxide semiconductor (such as a-IGZO, ZnO, ZnON, IZTO) and an organic material (such as sexithiophene, polythiophene).

For example, a material of the gate electrode 612, the first electrode 211, the second electrode 611 of the first thin film transistor 11, the gate electrode 212, the first electrode 613, the second electrode 614 of the second thin film transistor 12, and the first electrode 131 and the second electrode 132 of the capacitor 13 includes but is not limited to a commonly-used electrode material such as silver (Ag), copper (Cu), aluminum (Al) and molybdenum (Mo), or a multi-layer metal such as MoNb/Cu/MoNb, or an alloy of the above materials such as AlNd and MoNb.

For example, the first region 411 and the second region 412 of the first thin film transistor 11 may be a conductor which has been treated with a conduction treatment, the first region 411 is in direct contact with the first electrode 211 to form an electrical connection, and this structure has following advantages: effectively reducing parasitic capacitance of the first thin film transistor 11 so as to increase a charge speed of the circuit; reducing contact resistance of the channel region 413 and the first region 411 and the second region 412 so as to increase a carrier mobility of the first thin film transistor 11; effectively saving a layout area to increase an aperture ratio of the pixel. Similarly, the first region 415 and the second region 416 of the second thin film transistor 12 may also be a conductor which has been treated with a conduction treatment, so that contact resistance between the channel region 417 and the first region 415 and the second region 416 is reduced and a carrier mobility of the second thin film transistor 12 is improved.

For example, a material of the gate insulating layer 511, the buffer layer 311 of the first thin film transistor 11, the gate insulating layer 312, the etch stop layer 512 of the second thin film transistor 12 and the dielectric layer 133 of the capacitor 13 includes but is not limited to a conventional dielectric material, such as materials such as dielectric material of SiOx, SiNx, SiON and the like, or all kinds of organic insulating materials, or high-k materials such as AlOx, HfOx, TaOx.

For example, the substrate 100 may be a bendable and flexible substrate, such as various types of plastic films, for example, a substrate made of polyethylene terephthalate (PET), polyether sulfone (PES), polycarbonate (PC) or polyimide (PI), a derivate of the above or the like. Alternatively, the substrate 100 may be a rigid substrate, for example, a glass substrate, a stainless steel substrate and the like.

The pixel circuit provided by embodiments and modified embodiments thereof of the present disclosure adopts a top-gate switch transistor and a bottom-gate driving transistor and combines advantages of both transistors, so as to allow the pixel circuit to have a relatively high switching speed as well as a relatively large driving current, so that a display performance of the display device is improved. Meanwhile, the second thin film transistor is in a bottom-gate structure and has a light-shielding function, so as to alleviate a nonuniform display problem of a thin film transistor caused by light during a negative bias thermal illumination stress (NBTIS) test and to decrease a compensation difficulty of the pixel compensation circuit.

An embodiment of the present disclosure provides a manufacturing method of the above pixel circuit, and the method at least comprises: providing a substrate; forming a first thin film transistor and a second thin film transistor, wherein the first thin film transistor is in a top-gate structure, and the second thin film transistor is in a bottom-gate structure; a first electrode of the first thin film transistor and a gate electrode of the second thin film transistor are formed to be electrically connected with each other and be located in a same layer, by forming a first metal layer on the substrate and patterning the first metal layer.

An exemplary manufacturing method of a pixel circuit provided by an embodiment of the present disclosure is described below in combination with FIG. 5A-FIG. 9B.

Step S51, providing a substrate 100, and cleaning and drying the substrate 100. The substrate 100 may be a bendable and flexible substrate, such as various types of plastic films, for example, a substrate made of polyethylene terephthalate (PET), polyether sulfone (PES), polycarbonate (PC) or polyimide (PI), a derivate of the above or the like. Or, the substrate 100 may be a rigid substrate, such as a glass substrate and a stainless steel substrate. A first zone, a second zone and a third zone are defined on the substrate 100, respectively corresponding to a first thin film transistor 11, a second thin film transistor 12 and a capacitor 13.

Figure 5A:
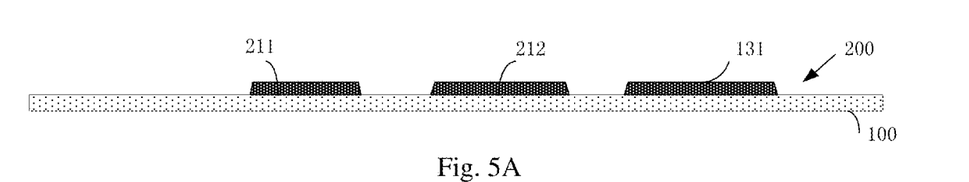
FIG. 5A-5B, FIG. 6-FIG. 8 and FIG. 9A-9B are schematic sectional views of an array substrate of a pixel circuit in steps of an exemplary manufacturing method provided by an embodiment of the present disclosure.
Figure 5B:
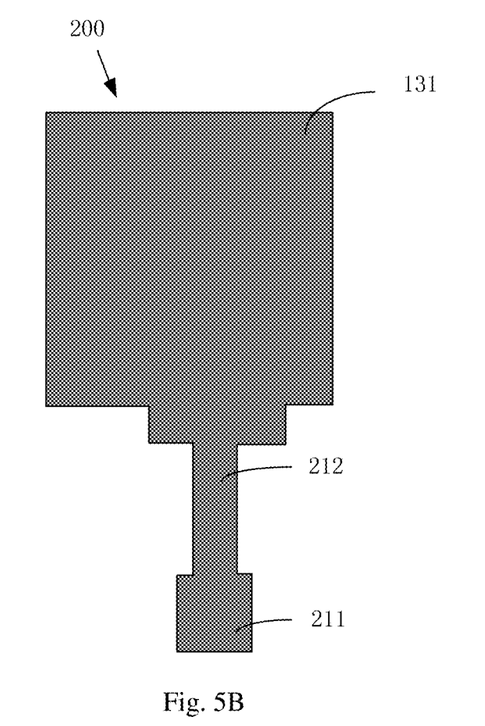

Step S52, as illustrated in FIG. 5A, forming a first metal layer 200 and patterning the first metal layer 200 through a first patterning process, so as to form a first electrode 211 of the first thin film transistor 11, a gate electrode 212 of the second thin film transistor 12, and a first electrode 131 of the capacitor respectively in the first zone, the second zone and the third zone, which are electrically connected with each other. A plan view of the first metal layer 200 after the patterning process is illustrate in FIG. 5B. As can be seen from the figure, the first electrode 211 of the first thin film transistor 11, the gate electrode 212 of the second thin film transistor 12, and the first electrode 131 of the capacitor are electrically connected with each other. FIG. 5B shows a pattern which is exemplarily formed, FIG. 5A is a schematic view drawn for the sake of a convenient description and display, and FIG. 5A and FIG. 5B do not correspond to each other in size and shape in a one-to-one correspondence.

Figure 6:
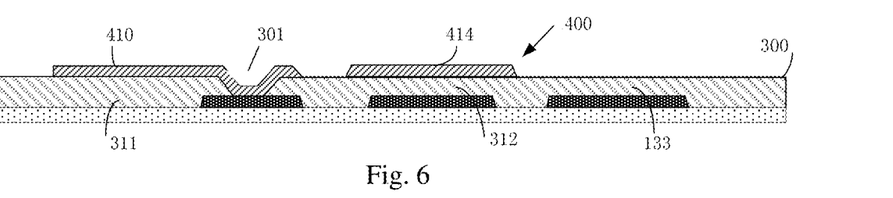

Step S53, as illustrated in FIG. 6, forming a first insulating layer 300 on the first metal layer 200, and patterning the first insulating layer 300 through a second patterning process to form a via hole 301 which exposes at least a portion of the first electrode 211 of the first thin film transistor 11. In this way, a buffer layer 311 of the first thin film transistor 11, a gate insulating layer 312 of the second thin film transistor 12 and a dielectric layer 133 of the capacitor 13 are formed.

For example, a chemical vapor deposition (PECVD) process may be adopted to form the first insulating layer 300, and the chemical vapor deposition process may be optimized to obtain a gate insulating layer 312 with a relatively low density of Interface trap defects. Meanwhile, due to an increased quality, a thickness of the first insulating layer 300 may be properly reduced and thereby a capacitance value of the capacitor 13 may be effectively increased and the display performance is improved.

Step S54, as illustrated in FIG. 6, forming a semiconductor layer 400 on the first insulating layer 300 and patterning the semiconductor layer 400 through a third patterning process to form an active layer 410 of the first thin film transistor 11 and an active layer 414 of the second thin film transistor 12. The active layer 410 of the first thin film transistor 11 fills the via hole 301 and contacts the exposed portion of the first electrode 211 of the first thin film transistor 11. For example, a material of the semiconductor layer 400 includes but is not limited to a silicon-based material (such as amorphous silicon a-Si, polycrystalline silicon p-Si), a metal oxide semiconductor (such as a-IGZO, ZnON, IZTO) and an organic material (such as sexithiophene, polythiophene).

Figure 7:
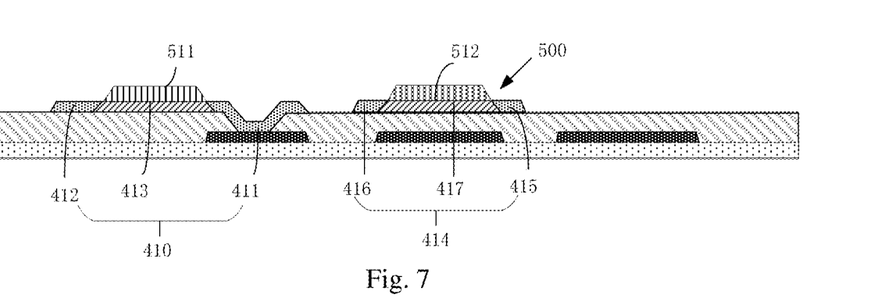

Step S55, as illustrated in FIG. 7, forming a second insulating layer 500 on the semiconductor layer 400 and patterning the second insulating layer 500 through a fourth patterning process to form a gate insulating layer 511 on the active layer 410 of the first thin film transistor 11, an etch stop layer 512 on the active layer 414 of the second thin film transistor 12 and a dielectric layer 133 of the capacitor 13. For example, the gate insulating layer 511 of the first thin film transistor 11 partially covers the active layer 410 and the etch stop layer 512 of the second thin film transistor 12 partially covers the active layer 414.

Figure 8:
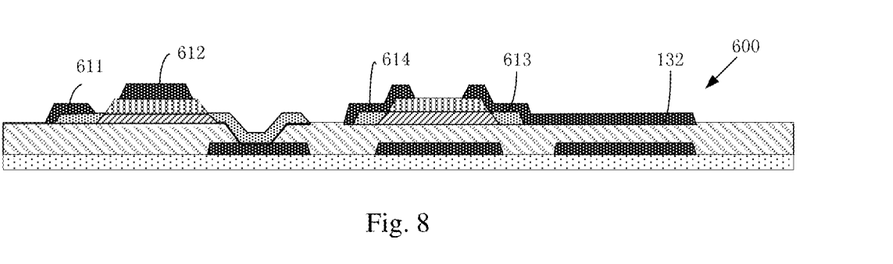

Step S56, as illustrated in FIG. 8, forming a second metal layer 600 on the second insulating layer 500 and patterning the second metal layer 600 through a fifth patterning process to form a second electrode 611 and a gate electrode 612 of the first thin film transistor 11, a first electrode 613 and a second electrode 614 of the second thin film transistor 12, and a second electrode 132 of the capacitor 13. For example, the second electrode 611 of the first thin film transistor 11 is located at a side, which is away from the first electrode 211, of the gate insulating layer 511, an contacts a portion, which is not covered by the gate insulating layer 511, of the active layer 410 of the first thin film transistor 11; the first electrode 613 and the second electrode 614 of the second thin film transistor 12 are located at opposite sides of the etch stop layer 512 and respectively contact portions, which are not covered by the etch stop layer 512, of the active layer 414 of the second thin film transistor 12.

In this way, the top-gate first thin film transistor 11, the bottom-gate second thin film transistor 12 and the capacitor 13 which are electrically connected with each other are formed on the substrate 100. The first electrode 211 of the first thin film transistor 11, the gate electrode 212 of the second thin film transistor 12 and the first electrode 131 of the capacitor 13 are electrically connected with each other, and the second electrode 132 of the capacitor 13 is electrically connected with the first electrode 613 of the second thin film transistor 12.

Figure 9A:
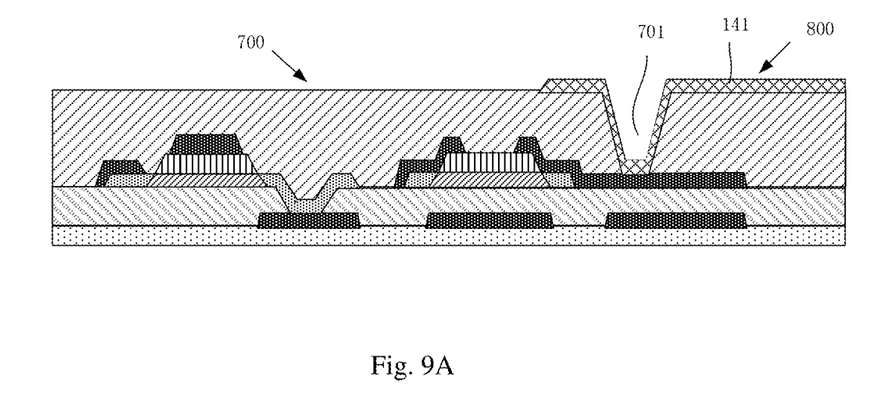
Figure 9B:
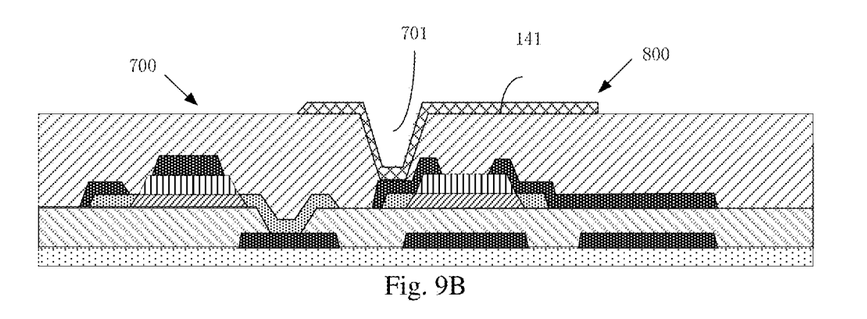

As illustrated in FIG. 9A, a step S57 may be further comprised after the above step S56: forming a passivation layer 700 on the second metal layer 600 and performing a planarization process on the passivation layer 700, and patterning the passivation layer 700 to form a via hole 701 through a sixth patterning process and expose at least a portion of the first electrode 613 of the second thin film transistor 12; then forming a conductive layer 800 which fills the via hole 701 and contacts the exposed portion of the first electrode 613 of the second thin film transistor 12, on the passivation layer 700; patterning the conductive layer to form a pixel electrode 141. The conductive layer may be exemplarily indium tin oxide (ITO) or a metal layer according to a requirement. Then, an OLED element may be further formed on the pixel electrode 141 and thereby the pixel circuit structure as illustrated in FIG. 2 is formed. Alternatively, the via hole 701 may be formed in a position corresponding to the second electrode 614 of the second thin film transistor 12 and exposes at least a portion of the second electrode 614 of the second thin film transistor 12, and the conductive layer 800 fills the via hole 701 and contacts the exposed portion of the second electrode 614 of the second thin film transistor 12, as illustrated in FIG. 9B. In this way, the pixel circuit structure as illustrated in FIG. 4 is formed.

Further, before the step S55 and after the step S56, it may be further comprised: performing a conduction treatment on a portion, which is not covered by the gate insulating layer 511 of the first thin film transistor 11, of the active layer 410 of the first thin film transistor 11, and on a portion, which is not covered by the etch stop layer 512, of the active layer 414 of the second thin film transistor 12. In this way, the active layer 410 of the first thin film transistor 11 comprises a conductive first region 411 and a conductive second region 412, and a semiconductor channel region 413 between the first region 411 and the second region 412. The active layer 414 of the second thin film transistor 12 comprises a conductive first region 415 and a conductive second region 416, and a semiconductor channel region 417 between the first region 415 and the second region 416. The first region 411 and the second region 412 of the first thin film transistor 11 respectively contact the first electrode 211 and the second electrode 611 of the first thin film transistor 11, and the first region 415 and the second region 416 of the second thin film transistor 12 respectively contact the first electrode 613 and the second electrode 614 of the second thin film transistor 12. The conduction treatment on the active layer 410 of the first thin film transistor 11 and the conduction treatment on the active layer 414 of the second thin film transistor 12 are performed in a same process; for example, the conduction treatment may comprise performing ion implantation or a plasma treatment or the like on the active layer 410 of the first thin film transistor 11 and the active layer 414 of the second thin film transistor 12 using the gate insulating layer 511 of the first thin film transistor 11 and the etch stop layer 512 of the second thin film transistor 12 as a mask. The conduction treatment reduces contact resistance between the active layer and the first electrode and the second electrode of the thin film transistor, which helps to increase a carrier mobility of the thin film transistor and further increase a switching speed and a driving current of the thin film transistor.

In another example, in a condition that it is not needed to perform a conduction treatment on the active layer 410 of the first thin film transistor 11 and the active layer 414 of the second thin film transistor 12, the second insulating layer which forms the gate insulating layer 511 of the first thin film transistor 11 and the etch stop layer 512 of the second thin film transistor 12 may respectively cover the a surface of the substrate comprising the active layer 410 and the active layer 414; and then a patterning process is performed to form via holes which expose the active layer so as to allow the source electrode or the drain electrode which is formed to contact the active layer.

The first thin film transistor 11 and the second thin film transistor 12 may be n-type thin film transistors or p-type thin film transistors. The first electrode 211 of the first thin film transistor 11 may be a source electrode or a drain electrode, accordingly the second electrode 611 may a drain electrode or a source electrode, the first region 411 may be a source region or a drain region, and the second region 413 may be a drain region or a source region. The first electrode 613 of the second thin film transistor 12 may be a source electrode or a drain electrode, accordingly the second electrode 614 may a drain electrode or a source electrode, the first region 415 may be a source region or a drain region, and the second region 416 may be a drain region or a source region.

The patterning process in the embodiments of the present disclosure usually comprises coating a photoresist, exposing, developing, etching, lifting off the photoresist and the like.

In the manufacturing method for manufacturing a pixel circuit provided by embodiments of the present disclosure, a top-gate switch transistor and a bottom-gate driving transistor are formed in a same process simultaneously. The process is easily realized and the cost is decreased.

Figure 10:
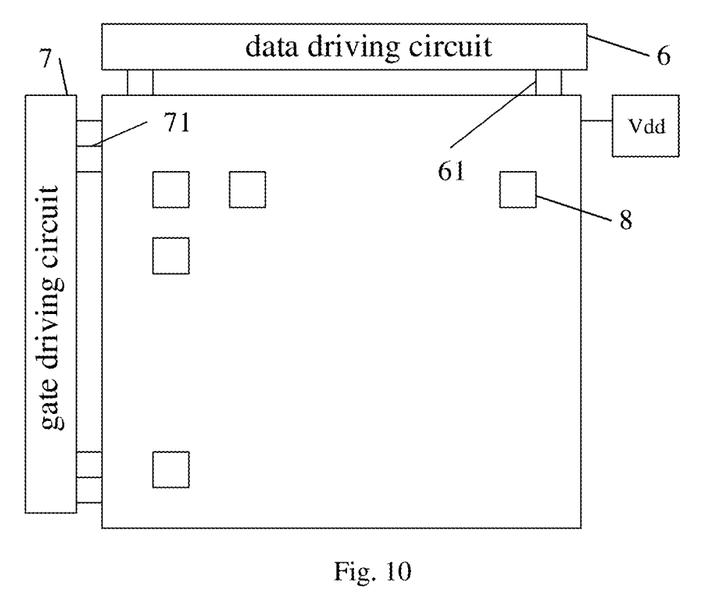
FIG. 10 is a schematic view of an organic light emitting diode display device provided by an embodiment of the present disclosure.

FIG. 10 is a schematic frame diagram of an organic light emitting diode display device 20 provided with the above pixel circuit according to an embodiment of the present disclosure. The organic light emitting diode display device 20 comprises a plurality of pixel units 8 arranged in an array, each pixel unit comprises at least one organic light emitting diode and the above pixel circuit connected with the organic light emitting diode, and the organic light emitting diode is driven to emit light by the pixel circuit.

The organic light emitting diode display device 20 may further comprise a data driving circuit 6 and a gate driving circuit 7. The data driving circuit 6 is configured to provide a data signal, and the gate driving circuit 7 is configured to provide a scan signal (e. g. the signal Vscan), and may be further configured to provide all kinds of control signals. The data driving circuit 6 is electrically connected with the pixel unit 8 through a data line 61, and the gate driving circuit 7 is electrically connected with the pixel unit 8 through a scan line 71. The data driving circuit 6 and the gate driving circuit 7 may be realized as a semiconductor chip.

The display device may further comprise other components, such as a timing controller, a signal decode circuit and a voltage converting circuit, and these components may adopt conventional components, which is not repeated here.

In the pixel circuit, a manufacturing method thereof and the display device according to embodiments of the present disclosure, the pixel circuit comprises a top-gate switch transistor and a bottom-gate driving transistor, and advantages of both structures are combined so as to enable the pixel circuit to have a relatively high switching speed as well as a relatively large driving current, and thereby a display performance of the display device is improved. The top-gate switch transistor and the bottom-gate driving transistor of the pixel circuit may be formed in a same process, the process is easily realized and the cost is saved.

Those skilled in the art can easily understand that other pixel driving circuit structures besides the basic 2T1C pixel driving circuits, for example, nTmC (n and m both are positive integers) such as 5T1C, 7T1C pixel driving circuits, are all covered by the present disclosure, as long as the thin film transistor corresponding to the switch transistor is in a top-gate structure and the thin film transistor corresponding to the driving transistor is in a bottom-gate structure.

What are described above is related to the illustrative embodiments of the disclosure only and not limitative to the scope of the disclosure; the scopes of the disclosure are defined by the accompanying claims.

The application claims priority to the Chinese patent application No. 201710646875.2, filed on Aug. 1, 2017, the entire disclosure of which is incorporated herein by reference as part of the present application.

What is claimed is:

1. A pixel circuit, comprising:
    a substrate, and
    a first thin film transistor and a second transistor, disposed on the substrate,
    wherein the first thin film transistor is in a top-gate structure, and the second thin film transistor is in a bottom-gate structure;
    a first electrode of the first thin film transistor is electrically connected with a gate electrode of the second thin film transistor, and the first electrode of the first thin film transistor and the gate electrode of the second thin film transistor are in a same layer on the substrate and are both on a side of an active layer of the second thin film transistor close to the substrate;
    an active layer of the first thin film transistor and the active layer of the second thin film transistor are in a same layer and made of a same material;
    the active layer of the first thin film transistor comprises a first region, a second region and a channel region between the first region and the second region;
    the first region of the active layer of the first thin film transistor is electrically connected with the first electrode of the first thin film transistor through a via hole, and the first region is filled in the via hole.

2. The pixel circuit according to claim 1, further comprising a capacitor disposed on the substrate, the capacitor comprising a first electrode, a second electrode and a dielectric layer between the first electrode and the second electrode,
    wherein the first electrode of the capacitor is electrically connected with the first electrode of the first thin film transistor and the gate electrode of the second thin film transistor, and
    the first electrode of the capacitor, the first electrode of the first thin film transistor and the gate electrode of the second thin film transistor are in a same layer on the substrate.

3. The pixel circuit according to claim 2, wherein
    a gate electrode and a second electrode of the first thin film transistor, a first electrode and a second electrode of the second thin film transistor and the second electrode of the capacitor are in a same layer and made of a same material, and
    the first electrode of the second thin film transistor is electrically connected with the second electrode of the capacitor.

4. The pixel circuit according to claim 3, wherein
    the first thin film transistor further comprises a buffer layer between the first electrode and a the active layer of the first thin film transistor, and
    the buffer layer, a gate insulating layer of the second thin film transistor and the dielectric layer of the capacitor are in a same layer and are all on a side of the active layer of the first thin film transistor close to the substrate.

5. The pixel circuit according to claim 3, further comprising a pixel electrode, wherein the pixel electrode is electrically connected with the first electrode of the second thin film transistor and the second electrode of the capacitor.

6. The pixel circuit according to claim 3, further comprising a pixel electrode, wherein the pixel electrode is electrically connected with the second electrode of the second thin film transistor.

7. The pixel circuit according to claim 1, wherein the second thin film transistor further comprises an etch stop layer, and the etch stop layer is in a same layer as a gate insulating layer of the first thin film transistor.

8. The pixel circuit according to claim 1, wherein the first region and the second region of the active layer of the first thin film transistor are conductors.

9. A display device, comprising the pixel circuit according to claim 1.

10. The pixel circuit according to claim 2, wherein the second electrode of the capacitor and the first electrode of the second thin film transistor are in an integral structure.

11. The pixel circuit according to claim 3, wherein a gate insulating layer of the second thin film transistor and the dielectric layer of the capacitor are in a same layer and made of a same material.

12. The pixel circuit according to claim 1, wherein the first electrode and the second electrode of the first thin film transistor are respectively on opposite sides of the active layer of the first thin film transistor with respect to the substrate.

13. A manufacturing method of a pixel circuit, comprising:
    providing a substrate, and
    forming a first thin film transistor and a second thin film transistor on the substrate,
    wherein the first thin film transistor is in a top-gate structure, and the second thin film transistor is in a bottom-gate structure;
    a first electrode of the first thin film transistor and a gate electrode of the second thin film transistor are formed to be electrically connected with each other and disposed in a same layer, by forming a first metal layer on the substrate and patterning the first metal layer,
an active layer of the first thin film transistor and the active layer of the second thin film transistor are in a same layer and made of a same material;
the active layer of the first thin film transistor comprises a first region, a second region and a channel region between the first region and the second region;
the first region of the active layer of the first thin film transistor is electrically connected with the first electrode of the first thin film transistor through a via hole, and the first region is filled in the via hole.

14. The manufacturing method according to claim 13, wherein a capacitor, the first thin film a transistor and the second thin film transistor are formed simultaneously;
a first electrode of the capacitor is further formed by patterning the first metal layer, and the first electrode is electrically connected with the first electrode of the first thin film transistor and the gate electrode of the second thin film transistor.

15. The manufacturing method according to claim 13, wherein the forming the first thin film transistor and the second thin film transistor on the substrate comprises:
forming a first insulating layer on the first metal layer and patterning the first insulating layer to expose at least a portion of the first electrode of the first thin film transistor,
forming a semiconductor layer on the first insulating layer and patterning the semiconductor layer to form the active layer of the first thin film transistor and the active layer of the second thin film transistor, wherein the active layer of the first thin film transistor contacts the exposed portion of the first electrode of the first thin film transistor through the via hole,
forming a second insulating layer on the semiconductor layer and patterning the second insulating layer to form a gate insulating layer on the active layer of the first thin film transistor and an etch stop layer on the active layer of the second thin film transistor, and
forming a second metal layer on the second insulating layer and patterning the second insulating layer to form a second electrode and a gate electrode of the first thin film transistor, and a first electrode and a second electrode of the second thin film transistor.

16. The manufacturing method according to claim 15, wherein the forming the first thin film transistor and the second thin film transistor on the substrate further comprises:
after forming the semiconductor layer and before forming the second insulating layer, performing a conduction treatment on a portion, which is not covered by the gate insulating layer, of the active layer of the first thin film transistor, and on a portion, which is not covered by the etch stop layer, of the active layer of the second thin film transistor.

17. The manufacturing method according to claim 16, wherein the conduction treatment comprises:
performing ion implantation on the active layer of the first thin film transistor and the active layer of the second thin film transistor using the gate insulating layer of the first thin film transistor and the etch stop layer as a mask.

18. The manufacturing method according to claim 15, further comprising:
forming a passivation layer on the second metal layer,
patterning the passivation layer to expose at least a portion of the first electrode of the second thin film transistor, and
forming a conductive layer on the passivation layer, the conductive layer in contact with the portion, which is exposed, of the first electrode of the second thin film transistor.

19. The manufacturing method according to claim 15, further comprising:
forming a passivation layer on the second metal layer,
patterning the passivation layer to expose at least a portion of the second electrode of the second thin film transistor, and
forming a conductive layer on the passivation layer, the conductive layer in contact with the portion, which is exposed, of the second electrode of the second thin film transistor.

* * * * *